United States Patent [19]

Kayama

[11] Patent Number: 5,153,696
[45] Date of Patent: Oct. 6, 1992

[54] MOS FET WITH CURRENT SENSING TERMINAL

[75] Inventor: Chizuru Kayama, Tokyo, Japan

[73] Assignee: NEC Corporation, Tokyo, Japan

[21] Appl. No.: 633,797

[22] Filed: Dec. 26, 1990

[30] Foreign Application Priority Data

Dec. 29, 1989 [JP] Japan .................................. 1-342802

[51] Int. Cl.$^5$ ..................... H01L 27/02; H01L 29/10; H01L 29/04
[52] U.S. Cl. .................................. 357/41; 357/23.4; 357/51; 357/59
[58] Field of Search ...................... 357/41, 23.4, 51, 59

[56] References Cited

U.S. PATENT DOCUMENTS 4,553,084 11/1985 Wrathall ............................. 330/257

Primary Examiner—Mark V. Prenty
Attorney, Agent, or Firm—Laff, Whitesel, Conte & Saret

[57] ABSTRACT

A sense resistor is included in a semiconductor pellet constituting a MOS FET having current sensing terminal by providing a polysilicon film resistor between a source electrode and a Miller pad of the pellet. Any influence of external noise due to adaptive use of an external sense resistor is removed.

6 Claims, 7 Drawing Sheets

MOS FET WITH CURRENT SENSING TERMINAL

BACKGROUND OF THE INVENTION

The present invention relates to a power MOS FET and, more particularly, to such a MOS FET having a current sensing terminal.

A power MOS FET is usually constituted by a number of MOS FET cells which are connected in parallel to each other. It is frequently necessary to detect a current flowing through such a power MOS FET. Since such current may be increased, up to the order of 10 Amperes, it is not practical to measure such large current directly.

In order to solve this high current problem, a MOS FET having a current sensing terminal is disclosed in U.S. Pat. No. 4,553,084. In this patent, a current sensing element comprises a limited number of MOS FET cells connected in parallel with a power MOS FET. In such a MOS FET, having a current sensing terminal, the power MOS FET has a pair of source terminals. One of the source terminals is called a "Kelvin terminal" and the other to a "Miller terminal". A sense resistor having a value R is connected between the Miller terminal and the Kelvin terminal. A current I flowing through the power MOS FET can be defined by the following equation if the value R and a potential difference V across the sense resistor R are known:

$$V \approx IR/n$$

where n is a ratio number between MOS FET cells constituting the power MOS FET and MOS FET cells constituting the current sensing element.

Assuming that n=3000, R=30 ohms and I=10A, the potential difference V of 100 mV arises at both ends of the sense resistor R.

In the conventional MOS FET having a current sense terminal, the sense resistor is provided externally of the power MOS FET. Therefore, the sense resistor tends to be considerably influenced by external noise, causing the current detection to be inaccurate.

For a large external noise, it may be possible to detect the noise and to exclude it from a measured result. However, a circuit construction for performing these procedures may become very complicated and the sensing efficiency may be also degraded.

BRIEF SUMMARY OF THE INVENTION

An object of the present invention is to provide a MOS FET having a current sensing terminal which is capable of detecting current accurately.

Another object of the present invention is to provide a MOS FET having a current sensing terminal which is capable of detecting current efficiently.

A MOS FET having a current sensing terminal, according to the present invention, comprises a semiconductor pellet on which a number of MOS FET cells, preferably, vertical type MOS FET cells are formed integrally. A major number of MOS FET cells are connected in parallel with each other to constitute a power MOS FET the gate electrodes of the cells and the gate electrode of the current sensing element are connected to each other and to a common gate electrode wiring and gate pad. Source regions of all cells in the power MOS FET are connected to a source pad and a Kelvin pad. Source regions of the current sensing element are connected to a Miller pad. A resistive element for sensing current is disposed between the source electrode of the power MOS FET and the Miller pad. The resistive element includes, preferably, a film resistor made of material which is the same material as that of the gate electrode.

Thus, it is possible to integrate the sense resistor in the same semiconductor pellet. External noise can be shielded by a package in which the semiconductor pellet is mounted to remove the inaccuracy of current sensing due to external noise.

BRIEF DESCRIPTION OF THE DRAWINGS

The above mentioned and other objects, features and advantages of this invention will becomes more apparent by reference to the following detailed description of the invention taken in conjunction with the accompanying drawings, wherein.

DETAILED DESCRIPTION OF THE PREFERRED EMBODIMENTS

A first embodiment of the present invention will be described with reference to FIGS. 1 to 6.

Figure 1:
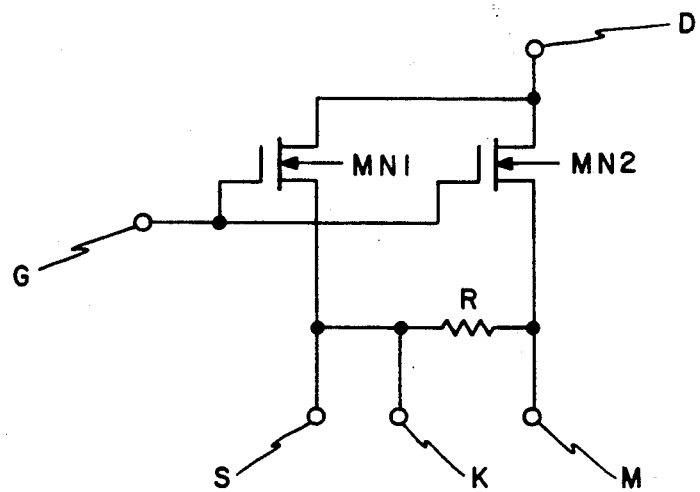
FIG. 1 is a circuit diagram of a MOS FET having a current sensing terminal, according to the present invention.

FIG. 1 is a circuit diagram of a MOS FET having a current sensing terminal, according to the present invention. The MOS FET comprises a MOS FET MN1 and a MOS FET MN2.

The MOS FET MN1 is a power MOS FET constituted by a plurality of MOS FET cells connected in parallel. A gate, a drain and a source of the MOS FET MN1 are connected to a gate terminal G, a drain terminal D and a source terminal S, respectively. The MOS FET MN2 is constituted by a single or a small number of MOS FET cells connected in parallel. A gate and a drain of the MOS FET MN2 are connected to the gate terminal G and the drain terminal D, respectively, and a source thereof is connected to a Miller terminal M. A sense resistor R is connected between a Kelvin terminal K connected to the source terminal S and the Miller terminal M. The sense resistor R is integrated on a semiconductor pellet on which the MOS FET MN1 and 2 are also integrated. In a conventional MOS FET having a current sensing terminal, such a sense resistor is not included as part of the integrated circuit, but is adaptively connected between a Kelvin terminal and a Miller terminal as an external component when required.

Figure 2:
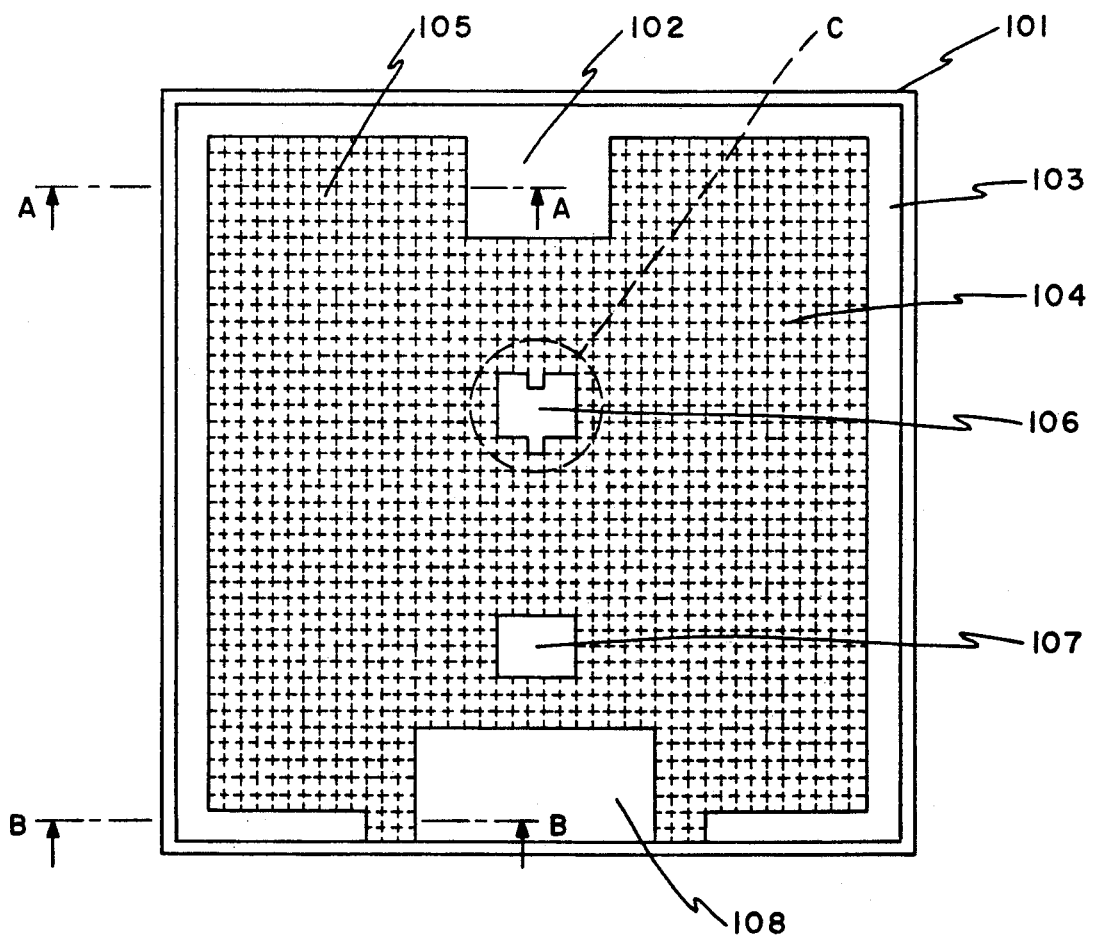
FIG. 2 is a schematic plan view of a semiconductor pellet for explaining a first embodiment of the present invention.

Referring to FIG. 2 which is a plan view of a semiconductor pellet 101 on which the MOS FETs MN1 and MN2 and the sense resistor R are integrated. A gate pad 102, gate electrode wirings 103 and 104, a Miller pad 106, a Kelvin pad 107 and a source pad 108 are also formed thereon. The semiconductor pellet 101 is mounted on a package (not shown). The gate pad 102, the Miller pad 106, the Kelvin pad 107 and the source pad 108 are wire-bonded to internal leads (not shown) of the package through which they are led to the gate terminal G, the Miller terminal M, the Kelvin terminal K and the source terminal S, respectively.

Figure 3:
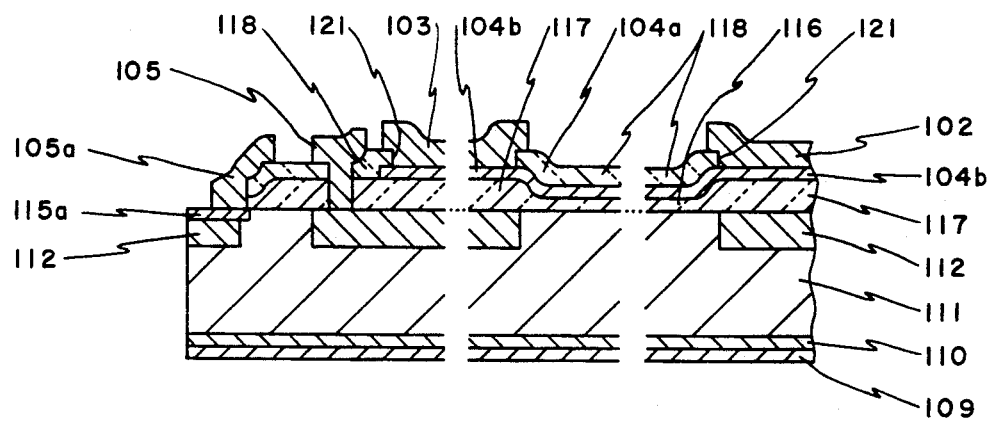
FIG. 3 is an enlarged cross sectin taken along a line A—A in FIG. 2.
Figure 4:
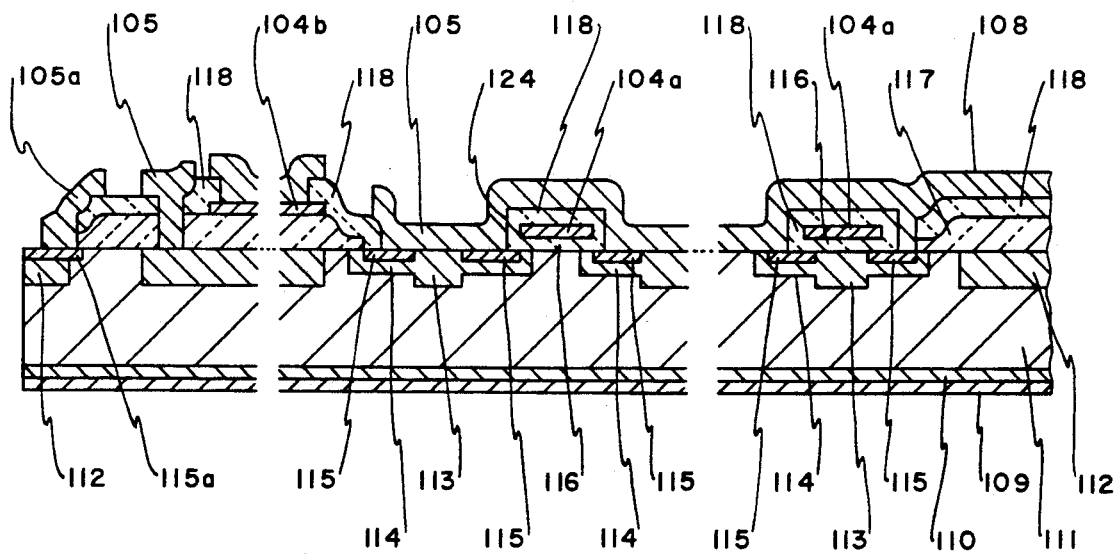
FIG. 4 is an enlarged cross section taken along a line B—B in FIG. 2.

FIG. 3 is a cross section taken along a line A—A in FIG. 2. FIG. 4 is a cross sectin taken along a line B—B in FIG. 2. In FIGS. 3 and 4, the gate electrode wiring 103 and the gate pad 102 are made of aluminum and are in contact with an underlying polysilicon film 104b. The polysilicon film 104b is connected to a polysilicon film 104a constituting a mesh type gate electrode.

The source pad 108 is made of an aluminum wiring layer separated from the gate electrode wiring 103 and is connected to the source electrode 105.

The Kelvin pad 107 has a construction which is similar to the construction of the source pad 108 except that an area thereof is smaller than that of the source pad 108.

Figure 5:
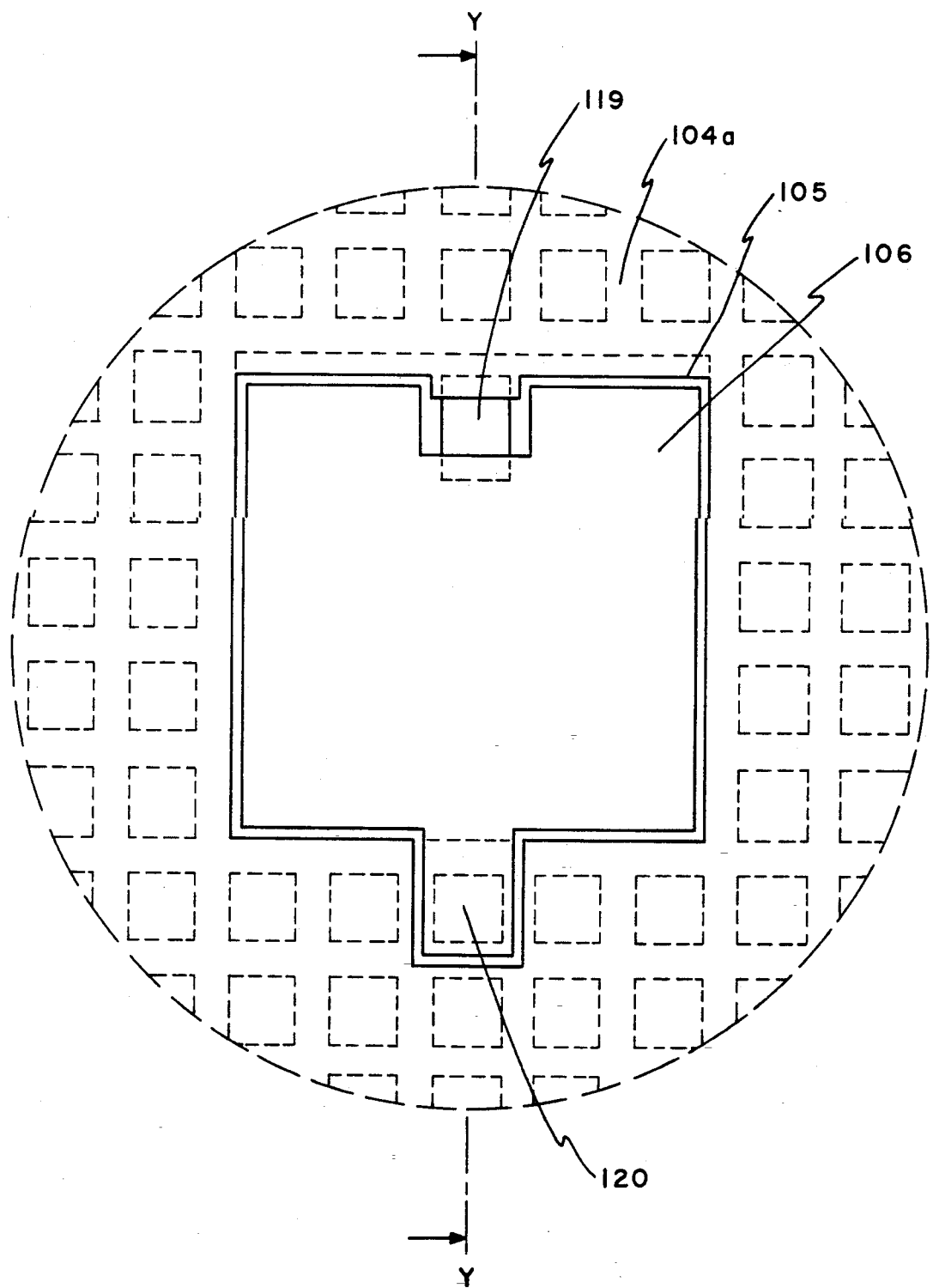
FIG. 5 is a schematic, enlarged plan view of a portion C in FIG. 2.
Figure 6:
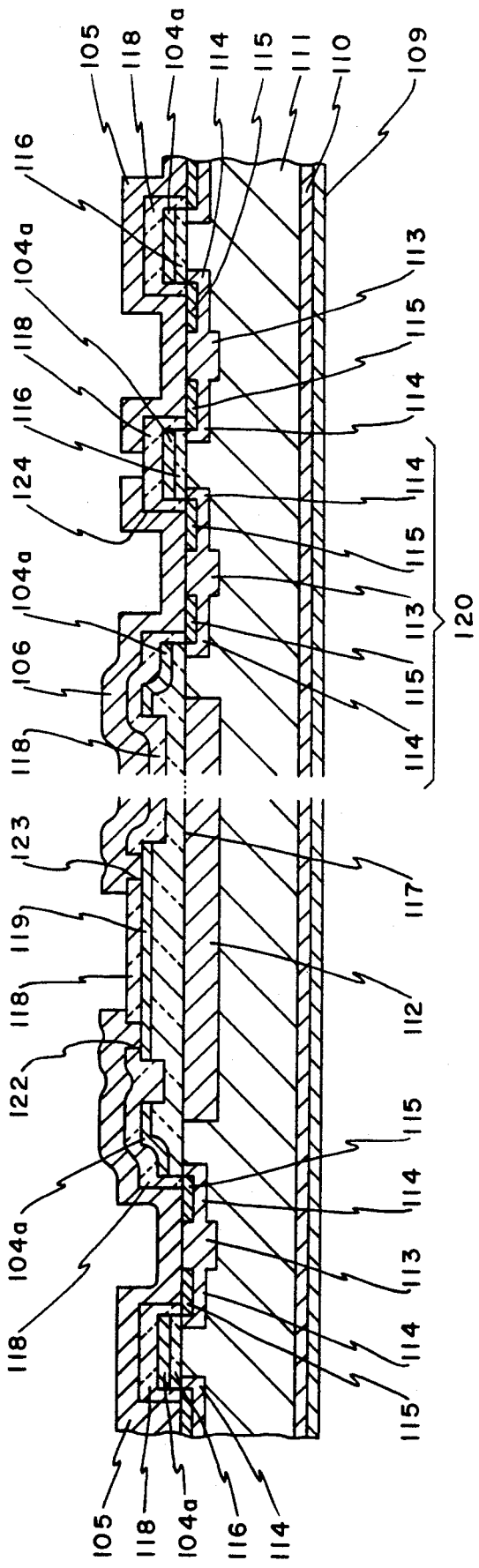
FIG. 6 is an enlarged cross section taken along a line Y—Y in FIG. 5.

FIG. 5 is an enlarged plan view of a portion of FIG. 2 corresponding to the Miller pad 106. FIG. 6 is a cross section taken along a line Y—Y in FIG. 5. In FIGS. 5 and 6, the Miller pad 106 is an aluminum layer arranged in the same layer as the gate pad 102, the gate wiring 103, the Kelvin pad 107, the source electrode 105 and the source pad 108. The Miller pad 106 is separate from the source electrode 105 and is connected to a source 120 of the MOS FET MN2.

A film resistor 119 is formed between the source electrode 105 and the Miller pad 106. The film resistor 119 is a polysilicon film formed simultaneously with the formation of the gate electrode 104a and constitutes a sense resistor R.

In FIGS. 3, 4 and 6, an N type silicon substrate 111 may be epitaxially formed on a substrate whose resistivity is 2.0 ohm-cm. An N+ type layer 110 having resistivity of 0.008 to 0.018 ohm-cm is formed on the entire lower surface thereof. The drain electrode 109 is an aluminum film formed on the N+ layer 110. P+ type layers 112 are formed in an upper surface of the substrate 111 in portions which are below the gate pad 102, the gate wiring 103, a main portion of the Miller pad 106, the Kelvin pad 107 and the source pad 108, respectively. On each P+ type layer 112, a silicon oxide film 117 having thickness of 600 nm is formed. The polysilicon film 104b covers an area of the layer 112 corresponding to the gate pad 102 and the gate electrode wiring 103. A film resistor 119 of polysilicon is provided on the silicon oxide film 117 in an area of the Miller pad 106. These polysilicon films are covered by an insulating film 118 of such as phosphosilicate glass (PSG). The gate pad 102 and the gate electrode wiring 103 are connected through contact holes 121 formed in the insulating film 118 to the polysilicon film 104b. Similarly, the film resistor 119 is connected through a hole 122 to the source electrode 105 and through a hole 123 to the Miller pad 106. The Kelvin pad 107 and the source pad 108 are provided directly on the insulating film 118.

The mesh type gate electrode 104a is formed on a gate insulating film 116 of silicon oxide and of 50 nm thickness which is formed on the surface of the semiconductor substrate 111. Below each open portion of the mesh of the gate electrode 104a, a P type base region 114 is provided on the surface of the N type silicon substrate 111, as shown in FIGS. 4 and 6. In a center portion of the P type base region 114, a P+ type base region 113 is provided. The P type base region 114 extends up to a portion immediately below the gate electrode 104a. The N type source region 115 is provided in a portion of the P type base region 114 immediately below the gate electrode 104a, so as to surround the gate electrode. The source electrode 105 is connected through holes 124 of the insulating film 118 to an N type source region 115 and a P+ type base region 113 of the respective MOS FET cells.

As shown in FIGS. 3 and 4, an N type layer 115a is formed in an outer periphery of the semiconductor chip simultaneously with formation of the N type source region 115. The layer 115a is separated from the source electrode 105 and serves as a channel stopper connected to the aluminum wiring layer 105a in the same layer.

As to the size of the MOS FET, the thickness and width of the gate electrode 104a are 600 nm and 13 μm, respectively. An area of the region defined by the P type base region 114 (square region shown in FIG. 5 by dotted lines) is 12 μm×12 μm. An area of the film resistor 119 is about 12 μm×16 μm, the resistance thereof being from 20 ohms to 30 ohms. A total number of MOS FET cells is about 3000. In this embodiment, the MOS FET MN2 is constituted with a single MOS FET cell.

The provision of the film resistor 119 between the source electrode 105 and the Miller pad 106 is the feature of the present invention over the conventional MOS FET having current sensing terminal.

As will be described later, there is no need for adding special steps for providing the film resistor 119. Further, the number of bonding pads is the same as the number of the conventional device or only four, i.e., the gate pad 102, the Miller pad 103, the Kelvin pad 107 and the source pad 108. The size of the semiconductor pellet is substantially the same as the size of the conventional ine.

A fabrication of the first embodiment shown in FIGS. 1 to 6 will be described with reference to FIG. 7.

Figure 7A:
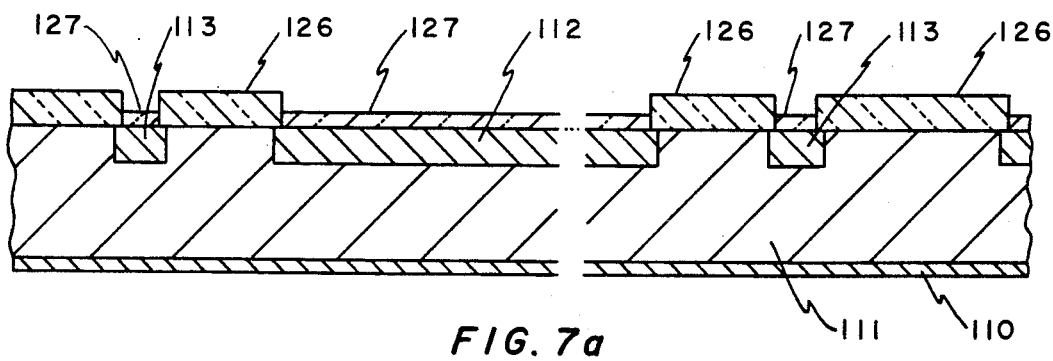
FIGS. 7a to 7d are cross sections of a semiconductor pellet, showing manufacturing steps according to a first embodiment of the present manufacturing method.

As shown in FIG. 7(a), an N type silicon substrate 111 having an N+ type layer 110 formed on a lower surface thereof is prepared first. Then, a silicon oxide film 126 having a thickness of 750 nm is formed by thermal oxidation of the substrate. Then, the silicon oxide film is selectively removed to form openings. Boron is ion-implanted through the openings into the substrate and then diffused to form P type channel stopper 112, P+ type base region 113 of a MOS FET cell and field rings (not shown). The ion-implantation is performed with the energy of 70 KeV and the dose of $1 \times 10^{14}/cm^2$, followed by a diffusion. Due to the diffusion after the ion-implantation, oxide films 127 are formed on surfaces of the P type regions 112 and 113.

Figure 7B:
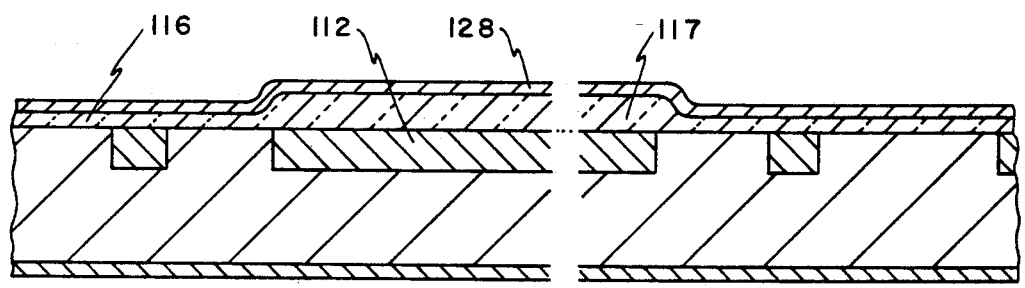

Thereafter, as shown in FIG. 7(b), the silicon oxide films 126 and 127 in the cell region are removed and a gate insulating film 116 of silicon oxide having a thickness of 50 nm is formed. Alternatively, it may be possible to completely remove the silicon oxide films 126 and 127, in order to form a silicon oxide film having a thickness in the range from 100 nm to 1000 nm, selectively remove the silicon oxide film, and form a gate insulating film 116. On the surface of the channel stopper 112 outside the cell region, an oxide film is grown with a growth of the gate oxide film, resulting in a thick oxide film 117. A polysilicon film 128 having a thickness of 600 nm is formed over the entire surface.

Figure 7C:
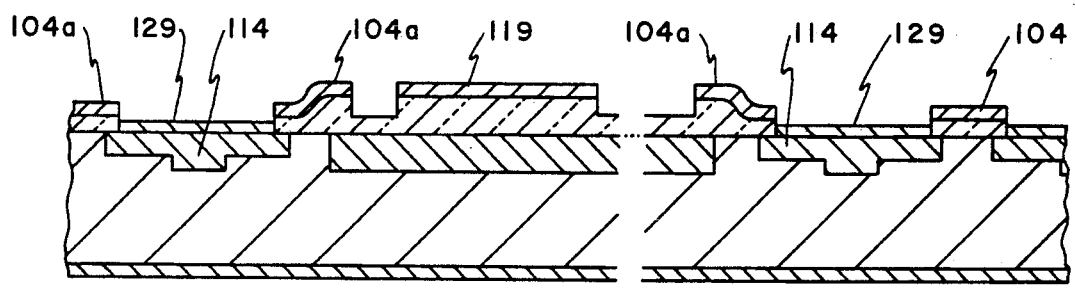

Then, as shown in FIG. 7(c), the polysilicon film 128 is selectively removed to pattern the gate electrode 104a and the film resistor 119. Thereafter, the gate insulating film 116 is removed by using the thus patterned gate electrode 104a and the film resistor 119 as a mask. Then, boron is ion-implanted with the energy of 70 KeV and with a dose of $9.0 \times 10^{13}/cm^2$. Then, a P type base region 114 is formed by Pa heat-treatment thereof. During this process, thin oxide film 129 is formed on the respective P type base region 114 and the P type base regions 113. Such a thin film is also formed on the gate electrode 104a and the film resistor 119.

Figure 7D:
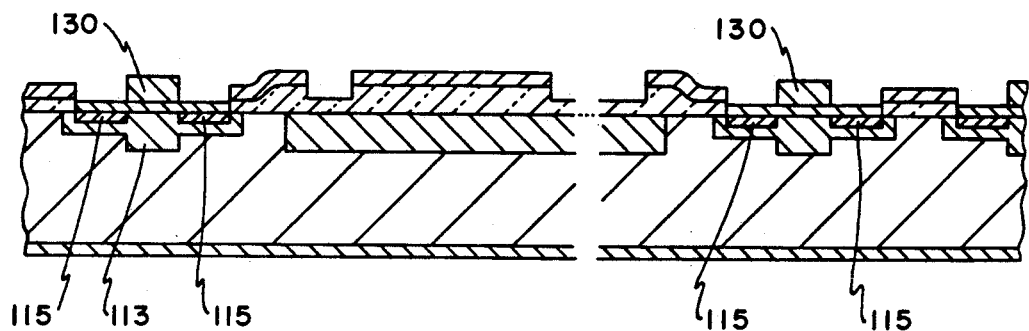

Then, as shown in FIG. 7(d), an aluminum film of 1.2 µm thickness is vapor-deposited. By selectively removing the aluminum film, an aluminum mask 130 is formed on the P+ type base region 113. Phosphorus is ion-implanted thereinto with an energy of 80 KeV and a dose of $5 \times 10^{15}/cm^2$ and then heat-treated to form an N+ type source region 115.

Then, as shown in FIG. 6, the aluminum mask 130 is removed, an insulating film 118 of a material such as phosphosilicate glass is deposited. Then, holes 122, 123 and 124 are formed in the insulating film 118. Then, an aluminum film is vapor-deposited and patterned to form a gate pad 102, a gate electrode wiring 103, a source electrode 105, a mirror pad 106, a Kelvin pad 107 and a source pad 108.

As described, the film resistor 119 can be formed simultaneously with formation of the gate electrode 104a without the necessity of adding any special fabrication steps.

Although the present invention has been described as to an embodiment in which a single film resistor 119 is inserted between the source electrode 105 and the Miller pad 106, it may be possible to insert a desired number of film resistors in parallel and to trim them by laser irradiation. In the latter case, it is possible to improve the accuracy of the current sensing resistor.

A second embodiment of the present invention will be described with reference to FIGS. 8 and 9.

Figure 8:
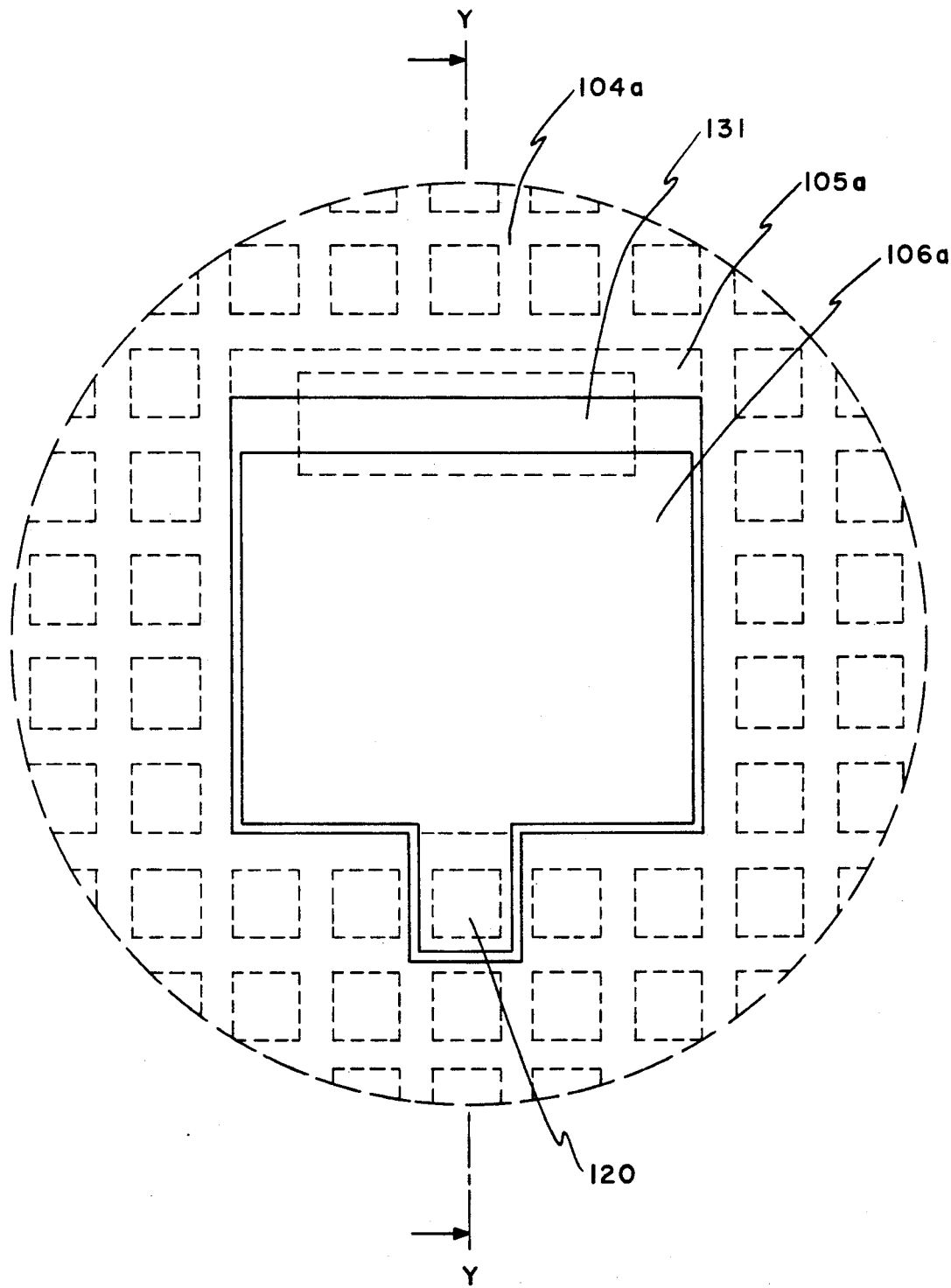
FIG. 8 is a schematic plan view of a portion of a semiconductor pellet for explaining a second embodiment of the present invention.
Figure 9:
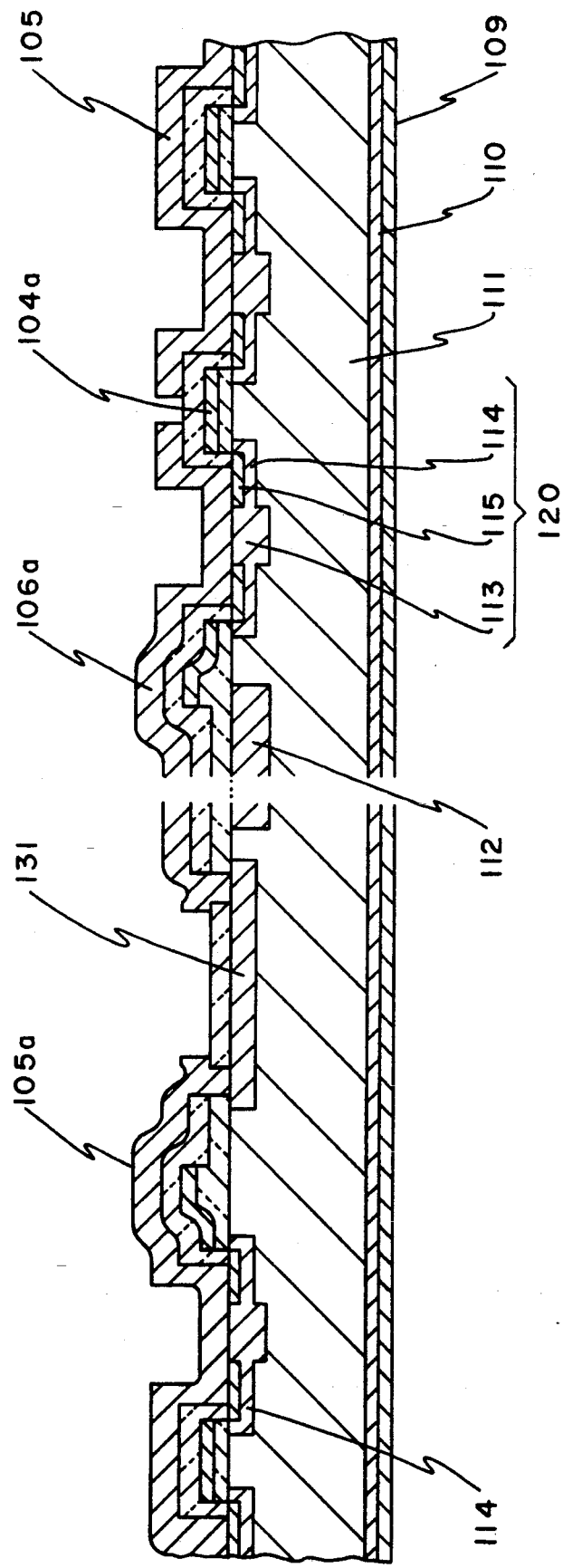
FIG. 9 is an enlarged cross section taken along a line Y—Y in FIG. 8.

In FIGS. 8 and 9, a P type diffusion layer 131 is provided between a source electrode 105a and a Miller pad 106a. The P type diffusion layer 131 is formed simultanesouly with formation of a P type base region 114. The embodiment utilizes a diffusion resistor as the sense resistor. An absolute accuracy of the resistance thereof is about 15% which is advantageous when compared with 20% of the polysilicon resistor. Since other portions of the second embodiment are substantially the same as those of the first embodiment and are depicted by the same reference numerals as those used in FIGS. 5 and 6, the details thereof are omitted.

As described, the MOS FET having current sense terminal, according to the present invention, allows a load current to be sensed as a potential difference between the Miller terminal and the Kelvin terminal by providing the current sensing resistor within the semiconductor pellet. Therefore, the current sensing is not influenced by external noise. Further, since there is no need of providing any adaptive external resistor, the construction of the detector is simple and the detection efficiency can be improved. Further, there is no need for any additional step for providing the internal sensing resistor. There is no increase of the number of wire bonding and/or external terminals.

Although, in the two embodiments, the present invention is applied to a double-diffusion, vertical type MOS FET, the present invention can also be applicable to a V-MOS FET. Further, it should be noted that the positions of the source electrode and the drain electrode are not limited to the respective surfaces of the semiconductor pellet.

Although the present invention has been described with reference to specific embodiments, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A MOS FET comprising:
   a power MOS FET composed of a plurality of MOS FET cells formed on a semiconductor substrate and connected in parallel with each other;
   a current sensing element composed of one of said MOS FET cells or a predetermined number of said MOS FET cells connected in parallel, said predetermined number being smaller than the number of said MOS FET cells constituting said power MOS FET, said MOS FET cells having source electrodes;
   a Miller pad on said semiconductor substrate and connected to said source electrodes of said MOS FET cells constituting said current sensing element;
   a Kelvin pad on said semiconductor substrate and connected to said source electrode of said power MOS FET, said Kelvin pad being separated from said Miller pad; and
   a resistive element formed by a resistive film on said semiconductor substrate and connected between said Miller pad and said Kelvin pad for sensing current.

2. A MOS FET as claimed in claim 1, wherein said resistive film is made of a polysilicon forming a polysilicon resistor.

3. A MOS FET comprising:
   a power MOS FET composed of a plurality of MOS FET cells formed on a semiconductor substrate and connected in parallel to each other;
   a current sensing element composed of one of MOS FET cells or a predetermined number of MOS FET cells connected in parallel, said predetermined number being smaller than the number of said MOS FET cells constituting said power MOS FET, said MOS FET cells having source electrodes;
   a Miller pad on said semiconductor substrate and connected to said source electrodes of said MOS FET cells constituting said current sensing element;
   a Kelvin pad on said semiconductor substrate and connected to said source electrode of said power MOS FET, said Kelvin pad being separated from said Miller pad; and
   a resistive element formed in said semiconductor substrate with a diffusion region forming a diffusion resistor, said diffusion resistor being connected between said Miller pad and said Kelvin pad for sensing current.

4. A MOS FET comprising:

a plurality of MOS FET cells, each of said cells including a drain region of a semiconductor substrate having a first conductivity type, a base region of a second conductivity type formed in a main surface of said semiconductor substrate, said second conductivity type being opposite to said first conductivity type, a source region of said first conductivity type formed in said base region, and a gate electrode on said base region between said drain region and said source region and through a gate insulating film;

a drain electrode, a source pad and a gate pad formed on said semiconductor substrate, said drain electrode, said source pad and said gate pad being connected to said drain regions, said source regions and said gate electrodes being connected commonly and respectively at a majority of said MOS FET cells;

a Miller pad on said semiconductor substrate and connected to some of all of the remaining minority of said MOS FET cells;

a Kelvin pad on said semiconductor substrate and connected to said source regions of said majority of said MOS FET cells, said Kelvin pad being separated from said Miller pad; and a resistive element formed by a resistive film on said semiconductor substrate, said resistive element being connected between said Miller pad and said Kelvin pad for sensing current.

5. A MOS FET as claimed in claim 4, wherein said gate electrode of said MOS FET cell and said resistive film are made of polysilicon.

6. A MOS FET comprising:

a plurality of MOS FET cells each including a drain region of a semiconductor substrate having a first conductivity type, a base region of a second conductivity type formed in a main surface of said semiconductor substrate, said second conductivity type being opposite to said first conductivity type, a source region of said first conductivity type formed in said base region and a gate electrode on said base region between said drain region and said source region and through a gate insulating film;

a drain electrode, a source pad and a gate pad formed on said semiconductor substrate, said drain electrode, said source pad and said gate pad to said drain regions, said source regions and said gate electrodes being connected commonly and respectively at a majority of said MOS FET cells;

a Miller pad on said semiconductor substrate and connected to at least some of the remaining minority of said MOS FET cells;

a Kelvin pad on said semiconductor substrate and connected to said source regions of said majority of said MOS FET cells, said Kelvin pad being separated from said Miller pad; and a resistive element formed by a diffusion region in said semiconductor substrate, said resistive element being connected between said Miller pad and said Kelvin pad for sensing current.

* * * * *